(12) United States Patent
Chou

(10) Patent No.: US 11,088,323 B2
(45) Date of Patent: Aug. 10, 2021

(54) TOP ELECTRODE LAST SCHEME FOR MEMORY CELL TO PREVENT METAL REDEPOSIT

(71) Applicant: Taiwan Semiconductor Manufacturing Co., Ltd., Hsin-Chu (TW)

(72) Inventor: Chung-Yen Chou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 46 days.

(21) Appl. No.: 16/197,526

(22) Filed: Nov. 21, 2018

(65) Prior Publication Data

US 2020/0075857 A1 Mar. 5, 2020

Related U.S. Application Data

(60) Provisional application No. 62/724,698, filed on Aug. 30, 2018.

(51) Int. Cl.
*H01L 45/00* (2006.01)
*H01L 27/24* (2006.01)

(52) U.S. Cl.
CPC ...... *H01L 45/1675* (2013.01); *H01L 27/2436* (2013.01); *H01L 45/1233* (2013.01); *H01L 45/1253* (2013.01); *H01L 45/146* (2013.01); *H01L 45/1608* (2013.01); *G11C 2213/52* (2013.01)

(58) Field of Classification Search
CPC ............ H01L 45/1675; H01L 27/2436; H01L 45/1253; H01L 45/1233; H01L 45/1608; G11C 2213/52
See application file for complete search history.

(56) References Cited

U.S. PATENT DOCUMENTS

| | | | | |
|---|---|---|---|---|
| 6,258,283 B1 * | 7/2001 | Mikami | ................. | B82Y 25/00 216/22 |
| 6,965,138 B2 * | 11/2005 | Nakajima | .............. | B82Y 10/00 257/295 |
| 8,339,841 B2 * | 12/2012 | Iwayama | ............... | B82Y 25/00 365/158 |
| 8,772,888 B2 * | 7/2014 | Jung | ....................... | H01L 43/12 257/421 |
| 8,872,149 B1 * | 10/2014 | Hsieh | ..................... | H01L 45/04 257/2 |

(Continued)

*Primary Examiner* — Bac H Au
(74) *Attorney, Agent, or Firm* — Eschweiler & Potashnik, LLC

(57) ABSTRACT

A method for forming a memory device is provided. The method including forming a memory cell stack over a lower interconnect layer over a substrate, the memory cell stack includes a data storage layer over a bottom metal. A first dielectric layer is formed over the memory cell stack. A first masking layer is formed over the first dielectric layer. The first masking layer overlies a center portion of the first dielectric layer and leaves a sacrificial portion of the first dielectric layer uncovered. A first etch of the first dielectric layer is formed according to the first masking layer. An inter-metal dielectric (IMD) layer is formed over the memory cell stack. A top electrode is formed within the IMD layer over the memory cell stack. An upper interconnect layer is formed over the top electrode. The upper and lower interconnect layers comprise a different material than the top electrode.

20 Claims, 8 Drawing Sheets

(56) References Cited

U.S. PATENT DOCUMENTS

| | | | |
|---|---|---|---|
| 9,231,197 B2* | 1/2016 | Tu | H01L 45/04 |
| 9,385,164 B2 | 7/2016 | Xie et al. | |
| 9,502,466 B1* | 11/2016 | Chuang | H01L 43/08 |
| 9,583,556 B2* | 2/2017 | Tu | H01L 45/1675 |
| 9,589,635 B2* | 3/2017 | Bajaj | H01L 45/06 |
| 9,685,608 B2* | 6/2017 | Maxwell | H01L 45/085 |
| 9,853,091 B2* | 12/2017 | Chou | H01L 27/2463 |
| 10,381,558 B1* | 8/2019 | Desu | H01L 45/12 |
| 2003/0193762 A1* | 10/2003 | Hayashi | G11B 5/39 360/324.12 |
| 2004/0027733 A1* | 2/2004 | Matsukawa | B82Y 40/00 360/324.2 |
| 2005/0248980 A1* | 11/2005 | Han | H01L 43/12 365/171 |
| 2006/0110878 A1* | 5/2006 | Lung | H01L 27/112 438/253 |
| 2008/0265347 A1* | 10/2008 | Iwayama | H01L 43/08 257/421 |
| 2010/0230655 A1* | 9/2010 | Noshiro | G11C 13/0007 257/5 |
| 2014/0166961 A1 | 6/2014 | Liao et al. | |
| 2014/0175365 A1 | 6/2014 | Chang et al. | |
| 2015/0028280 A1* | 1/2015 | Sciarrillo | H01L 27/2463 257/4 |
| 2015/0144859 A1 | 5/2015 | Chen et al. | |
| 2015/0318333 A1 | 11/2015 | Narayanan et al. | |
| 2016/0359110 A1* | 12/2016 | Banno | G11C 13/0007 |
| 2016/0365512 A1* | 12/2016 | Sung | H01L 45/146 |
| 2018/0019390 A1* | 1/2018 | Chen | H01L 27/2436 |
| 2019/0043795 A1* | 2/2019 | Chen | H01L 21/768 |
| 2019/0058109 A1* | 2/2019 | Chen | H01L 45/04 |

* cited by examiner

TOP ELECTRODE LAST SCHEME FOR MEMORY CELL TO PREVENT METAL REDEPOSIT

REFERENCE TO RELATED APPLICATION

This application claims priority to U.S. Provisional Application No. 62/724,698, filed on Aug. 30, 2018, the contents of which are hereby incorporated by reference in their entirety.

BACKGROUND

Many modern electronic devices contain electronic memory configured to store data. Electronic memory may be volatile memory or non-volatile memory. Volatile memory stores data only while it is powered, while non-volatile memory is able to keep data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
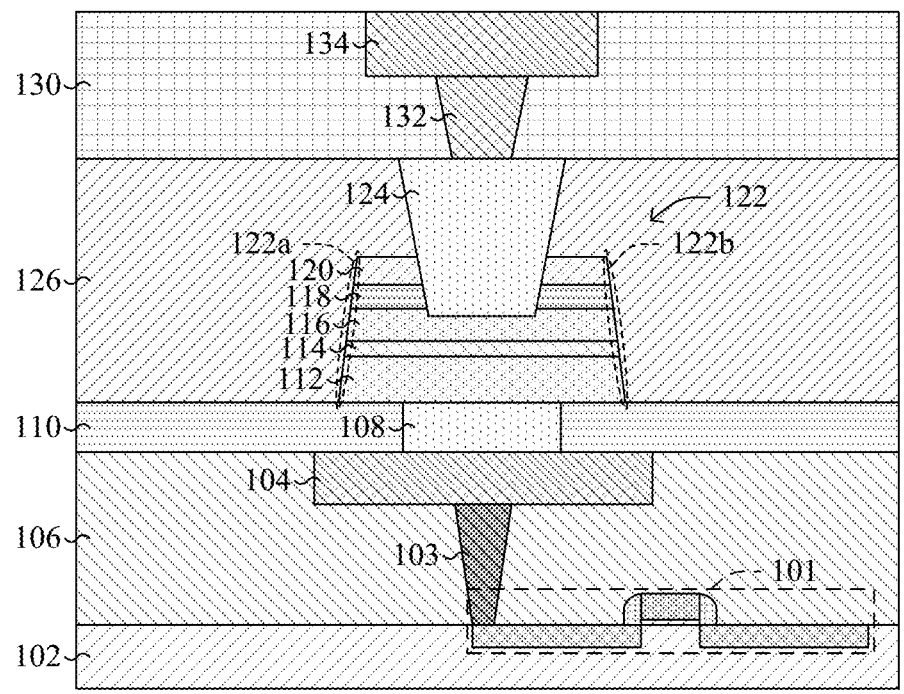
FIGS. 1A, 1B, and 1C illustrate cross-sectional views of some embodiments of a memory device, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a dielectric data storage layer placed between a top metal layer and a bottom metal layer. Depending on voltages applied to the top and bottom metal layers, the dielectric data storage layer will undergo a reversible change between a high resistance state associated with a first data state (e.g., a '0' or 'RESET') and a low resistance state associated with a second data state (e.g., a '1' or 'SET'). Once a resistance state is set, a RRAM cell will retain the resistive state until another voltage is applied to induce a RESET operation (resulting in a high resistance state) or a SET operation (resulting in a low resistance state). The top and bottom metal layers are disposed between a top electrode and a bottom electrode. A top electrode via or wire overlies and directly contacts the top electrode of the respective RRAM cell, providing a conductive path to the RRAM cell from metal layers disposed above.

During formation of an RRAM cell, a memory cell stack is formed over a substrate. The memory cell stack comprises a dielectric data storage layer disposed between a top metal layer and a bottom metal layer. A top electrode layer is formed over the top metal layer and a hard mask layer is formed over the top electrode layer. Separate etch processes are subsequently performed to define top and bottom electrodes. For example, a first etch process is performed to define a top electrode by patterning the top electrode layer and the top metal layer. During the first etch process, material from the top electrode layer will re-deposit onto sidewalls of the hard mask layer. During a second etch process used to pattern the bottom electrode, the material from the top electrode layer may be etched and redistributed onto sidewalls of the dielectric data storage layer. Since the material is conductive, the material may electrically short the top metal layer and the bottom metal layer, rendering the RRAM cell inoperable.

In some embodiments of the present disclosure, to eliminate the re-deposition of material from the top electrode layer onto sidewalls of the memory cell stack, the top electrode layer may be formed after patterning of the memory cell stack. In such embodiments, an etch stop layer is formed over the top metal layer of the memory cell stack, and a masking layer is formed over a center portion of the etch stop layer. A selective etch process is performed to define an RRAM cell by removing a portion of the etch stop layer, the masking layer, and the memory cell stack. An inter-metal dielectric (IMD) layer is formed over the RRAM cell. A top electrode (e.g. top electrode layer) is formed within the IMD layer and over the top metal layer of the RRAM cell. This new method mitigates the re-deposition of conductive material onto sidewalls of the RRAM cell during the selective etch process, and thereby prevents the memory cell stack from being shorted together.

Referring to FIG. 1A, a cross-sectional view of a memory device 100a including a memory cell 122 in accordance with some embodiments is provided.

The memory device 100a includes a memory cell 122 disposed over a substrate 102. A first inter-level dielectric (ILD) structure 106 comprising one or more ILD materials is disposed above the substrate 102. A transistor 101 is within the substrate 102 and first ILD structure 106. The memory cell 122 is coupled to the transistor 101 via a conductive contact 103 and an interconnect wire 104. A lower etch stop layer 110 is disposed between the memory cell 122 and the first ILD structure 106. A bottom electrode 108 is disposed between the interconnect wire 104 and the memory cell 122.

The memory cell 122 includes a bottom metal layer 112, a dielectric data storage layer 114, a top metal layer 116, a first dielectric layer 118, and a second dielectric layer 120. The bottom metal layer 112 is in direct contact with the bottom electrode 108 and the lower etch stop layer 110. The dielectric data storage layer 114 overlies the bottom metal layer 112. The top metal layer 116 overlies the dielectric data storage layer 114. The first dielectric layer 118 (in some embodiments referred to as an etch stop layer) overlies the top metal layer 116. The second dielectric layer 120 overlies the first dielectric layer 118. In some embodiments, outermost sidewalls of individual layers in the memory cell 122 are substantially aligned. An inter-metal dielectric (IMD) layer 126 is disposed over and around the memory cell 122. A top electrode 124 is disposed within the IMD layer 126 and directly contacts the top metal layer 116.

In some embodiments, the memory cell 122 is an RRAM cell. In the aforementioned embodiment, the dielectric data storage layer 114 comprises a material having a variable resistance configured to undergo a reversible phase change between a high resistance state and a low resistance. The dielectric data storage layer 114 may, for example, be or comprise a transitional metal oxide comprising one or more layers of hafnium oxide ($HfO_x$), aluminum oxide ($AlO_x$), tantalum oxide ($TaO_x$), other composite combinations such as hafnium aluminum oxide (HfAlO), or silicon oxide ($SiO_2$), a high K dielectric, or the like formed to a thickness within a range of approximately 10 Angstroms to approximately 150 Angstroms. In yet additional embodiments, the memory cell 122 is configured as a Magnetoresistive random access memory (MRAM) cell, a phase-change random access memory (PCRAM) cell, or a programmable metallization random access memory (PMRAM) cell.

A second ILD layer 130 is disposed over the memory cell 122 and the top electrode 124. A first conductive wire 134 overlies a first conductive via 132. The first conductive wire 134 and first conductive via 132 are disposed within the second ILD layer 130. The first conductive wire 134 and first conductive via 132 electrically couple the memory cell 122 to an overlying metal layer (such as a bit-line). Outer sidewalls of the first conductive via 132 are within outer sidewalls of the top electrode 124. Outer sidewalls of the top electrode 124 are within outer sidewalls of the first conductive wire 134.

In some embodiments, the bottom electrode 108 and the top electrode 124 may comprise a same material (e.g., TaN, TiN, etc.). In other embodiments, the bottom electrode 108 may comprise a first material (e.g., TaN) and the top electrode 124 may comprise a second material (e.g., TiN) different than the first material. In some embodiments, the interconnect wire 104 and the first conductive via 132 may comprise a material that is different than that of the bottom electrode 108 and the top electrode 124. For example, in some embodiments, the interconnect wire 104 and the first conductive via 132 may comprise copper (Cu) and the bottom electrode 108 and the top electrode 124 may comprise titanium nitride (TiN).

By overlying the top electrode 124 through the first dielectric layer 118 to contact the top metal layer 116 the re-deposition of conductive materials from the top electrode 124 to the outermost sidewalls 122a, 122b of the memory cell 122 is mitigated during fabrication of the memory cell 122. By mitigating the re-deposition of conductive materials from the top electrode 124, outermost sidewalls 122a, 122b of the memory cell 122 are not electrically shorted together by a conductive material, and thus the memory cell 122 can change between a high resistance state and a low resistance.

Figure 1B:
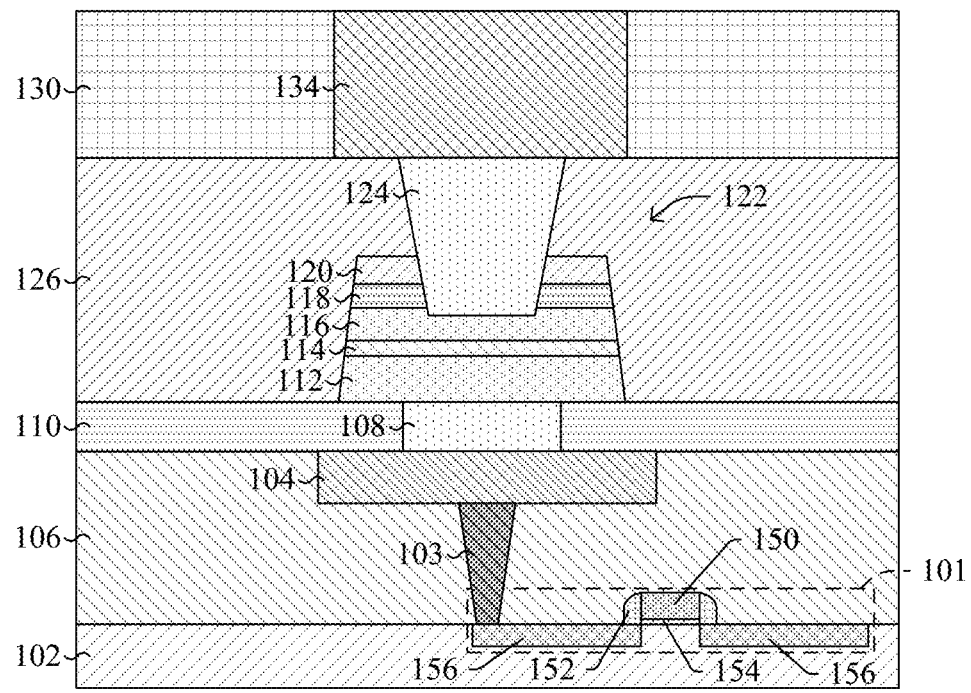

Referring to FIG. 1B, a cross-sectional view of a memory device 100b including a memory cell 122 in accordance with some embodiments is provided.

The memory device 100b includes a substrate 102. The substrate 102 may be, for example, a bulk substrate (e.g., a bulk silicon substrate), a silicon-on-insulator (SOI) substrate, P doped silicon, or N doped silicon. A transistor 101 is within the substrate 102 and the first ILD structure 106. The transistor 101 comprises a gate electrode 150, transistor sidewall spacers 152, a gate dielectric 154, and source/drain regions 156. An interconnect wire 104 is connected to the transistor 101 via a conductive contact 103. In some embodiments, the interconnect wire 104 may, for example, be or comprise aluminum, copper, or the like. A lower etch stop layer 110 overlies the first ILD structure 106 and surrounds a bottom electrode 108. The bottom electrode 108 electrically couples the interconnect wire 104 to a memory cell 122. In some embodiments, the bottom electrode 108 may, for example, be or comprise titanium nitride (TiN), titanium (Ti), tantalum (Ta), tantalum nitride (TaN), or the like, formed within a thickness of approximately 200 Angstroms and approximately 1000 Angstroms. In some embodiments, the first ILD structure 106 may, for example, be or comprise an oxide (e.g., $SiO_2$), a low κ dielectric, an extreme low κ dielectric, or a combination of the aforementioned dielectric materials formed within a thickness of approximately 500 Angstroms to approximately 3000 Angstroms.

The memory cell 122 is disposed directly over the lower etch stop layer 110 within an IMD layer 126. In some embodiments, the IMD layer 126 may, for example, be or comprise an oxide (e.g., $SiO_2$), a low κ dielectric, an extreme low κ dielectric, or a combination of the aforementioned dielectric materials formed within a thickness of approximately 500 Angstroms to approximately 3000 Angstroms. As used herein, a low κ dielectric may be, for example, a dielectric with a dielectric constant κ less than about 3.9, 2, or 1.5. In some embodiments, the lower etch stop layer 110 may, for example, be or comprise silicon carbide (SiC), silicon nitride (SiN), silicon oxynitride (SiON), silicon oxycarbide (SiOC), an oxide layer, or a combination of the aforementioned dielectric materials formed within a thickness of approximately 100 Angstroms to approximately 400 Angstroms.

In some embodiments, the memory cell 122 includes a bottom metal layer 112, a dielectric data storage layer 114, a top metal layer 116, a first dielectric layer 118, and a second dielectric layer 120. The bottom metal layer 112 overlies the bottom electrode 108 and lower etch stop layer 110. In some embodiments, the bottom metal layer 112 may, for example, be or comprise gold (Au), silver (Ag), Al, Cu, or the like formed to a thickness within a range of approximately 30 Angstroms to approximately 350 Angstroms. The dielectric data storage layer 114 overlies the bottom metal layer 112. In some embodiments, the dielectric data storage layer 114 may, for example, be or comprise $SiO_2$, a high K dielectric, hafnium oxide ($HfO_x$), aluminum oxide ($AlO_x$), tantalum oxide ($TaO_x$), or the like formed within a thickness of approximately 100 Angstroms to approximately 350 Angstroms. As used herein, a high K dielectric may be, for example, a dielectric with a dielectric constant K greater than about 3.9, 10, or 20. The top metal layer 116 overlies the dielectric data storage layer 114. In some embodiments, the top metal layer 116 may, for example, be or comprise Au, Cu, Ag, Al, or the like formed to a thickness within a range of approximately 30 Angstroms to approximately 350 Angstroms. The first dielectric layer 118 overlies the top metal layer 116. In some embodiments, the first dielectric layer 118 may, for example, be or comprise silicon carbide (SiC), silicon nitride (SiN), silicon oxynitride (SiON), silicon oxycarbide (SiOC), or the like formed within a thickness of approximately 500 Angstroms to approximately 2000 Angstroms. The second dielectric layer 120 overlies the first dielectric layer 118. In some embodiments, the second dielectric layer 120 may, for example, be or comprise $SiO_2$, SiN, silicon oxynitride (SiON) or the like formed within a thickness of approximately 50 Angstroms to approximately 500 Angstroms. In some embodiments, the second dielectric layer 120 and the dielectric data storage layer 114 comprise a same material. For example, in some embodiments, the second dielectric layer 120 and the dielectric data storage layer 114 comprise silicon oxide.

A top electrode 124 is disposed within the IMD layer 126. In some embodiments, the top electrode 124 contacts the top metal layer 116 through the first dielectric layer 118 and the second dielectric layer 120. In other embodiments (not shown), the top metal layer 116 may be omitted from the memory cell 122 and the top electrode 124 may directly contact the first dielectric layer 118 or a capping layer (not shown) that is on top of the first dielectric layer 118. The capping layer (not shown) is configured to store oxygen, which can facilitate resistive changes within the dielectric data storage layer 114. In various embodiments, the capping layer may comprise hafnium, titanium, tantalum, aluminum, zirconium, or the like. In some such embodiments, the top electrode 124 may laterally extend to outermost sidewalls of the dielectric data storage layer 114.

In some embodiments, the top electrode 124 may, for example, be or comprise titanium nitride (TiN), titanium (Ti), tantalum (Ta), tantalum nitride (TaN), or the like formed within a thickness of approximately 200 Angstroms and approximately 2000 Angstroms. In some embodiments, the top electrode 124 comprises angled sidewalls, where a topmost surface of the top electrode 124 comprises a first width greater than a second width of a bottommost surface of the top electrode 124. The bottommost surface of the top electrode 124 is below a topmost surface of the top metal layer 116. A maximum width of the top electrode 124 is respectively within and less than a maximum width of the top metal layer 116. In some embodiments, a material of the top and bottom electrodes 124, 108 are the same and respectively different than a material of the top and bottom metal layers 116, 112. In some embodiments, a bottom surface of the top electrode 124 is below an upper surface of the top metal layer 116. In some embodiments, the bottom surface of the top electrode 124 is aligned with the upper surface of the top metal layer 116. Outermost sidewalls of the top electrode 124 are within outermost sidewalls 122a, 122b of the memory cell 122. Outermost sidewalls 122a, 122b of the memory cell 122 may be in direct contact with the IMD layer 126.

A second ILD layer 130 is disposed over the memory cell 122 and top electrode 124. In some embodiments the second ILD layer 130 may, for example, be or comprise $SiO_2$, a high κ dielectric, a low κ dielectric, or the like. In some embodiments, a material of the second ILD layer 130 is different than a material of the IMD layer 126. A first conductive wire 134 overlies the top electrode 124. In some embodiments, the first conductive wire 134 may, for example, be or comprise Cu, Al, or the like. Outermost sidewalls of the top electrode 124 are within outermost sidewalls of the first conductive wire 134. The first conductive wire 134 electrically couples the memory cell 122 to any overlying metal layers (such as a bit line).

Figure 1C:
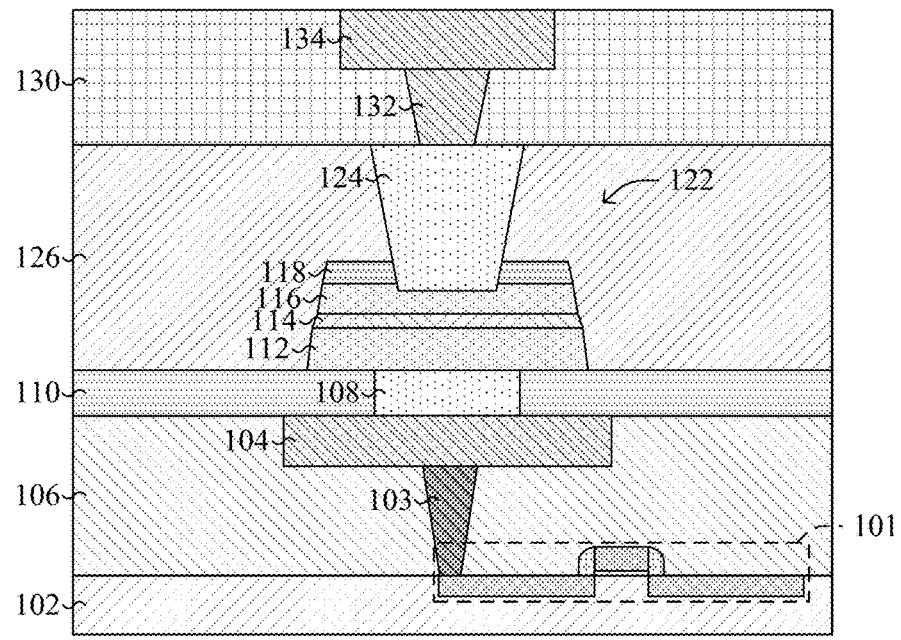

With reference to FIG. 1C, a cross-sectional view 100c of some alternative embodiments of the memory device of FIG. 1A is provided in which the second dielectric layer (120 of FIG. 1A) is omitted. In some embodiments, a topmost surface of the first dielectric layer 118 is in direct contact with a bottom surface of the IMD layer 126.

Figure 2:
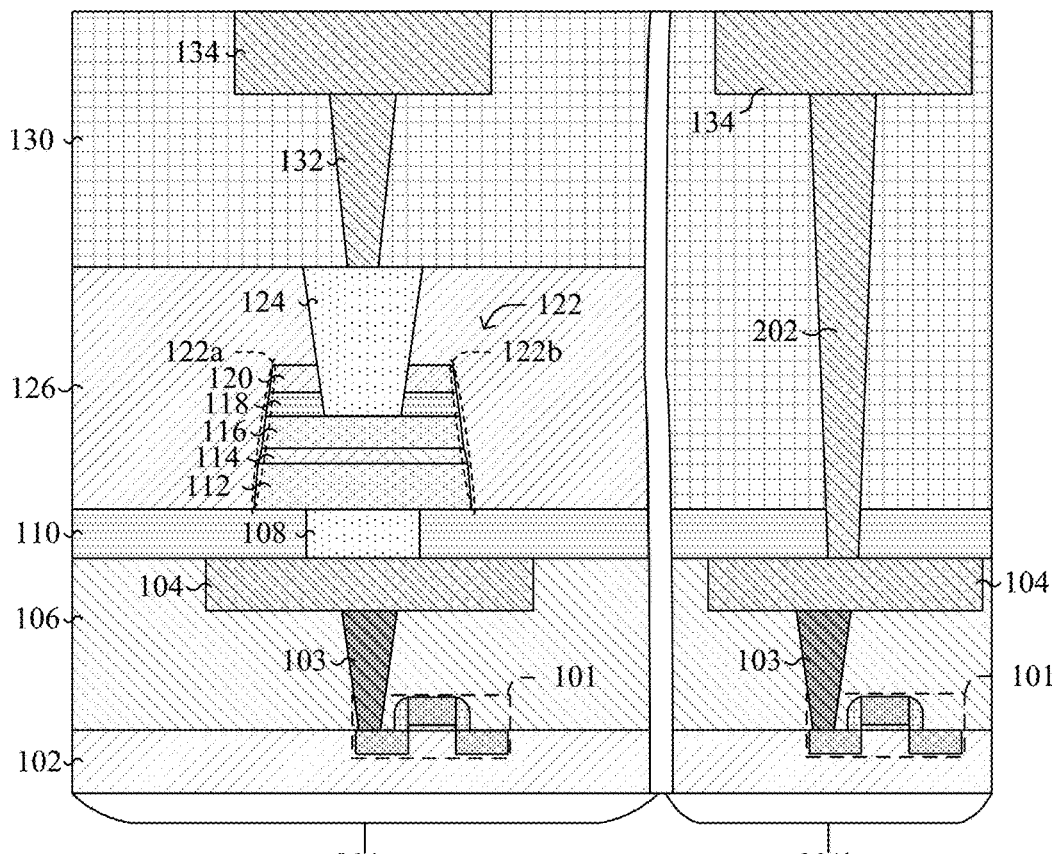
FIG. 2 illustrates a cross-sectional view of some embodiments of a memory device including a memory region and a logic region, according to the present disclosure.

Referring to FIG. 2, a cross-sectional view of a memory device 200 including a memory array region 201a comprising a memory cell 122 and a logic region 201b, in accordance with some embodiments is provided. The memory cell 122 within the memory array region 201a is as the memory cell 122 of FIG. 1A is described and labeled.

Within the logic region 201b a transistor 101 is disposed within the substrate 102 and the first ILD structure 106. The transistor 101 is electrically coupled to the interconnect wire 104 via a conductive contact 103. A second conductive via 202 is disposed within the lower etch stop layer 110 and the second ILD layer 130. In some embodiments, the second conductive via 202 may, for example, be or comprise Cu, Al, or the like. The first conductive wire 134 overlies the second conductive via 202. In some embodiments, the logic region 201b does not comprise the IMD layer 126.

A first conductive via 132 is arranged on the memory cell 122. The second conductive via 202 vertically extends from below a bottom of the first conductive via 132 to a horizontal plane extending in parallel to an upper surface of the substrate 102 and along a top of the first conductive via 132. Because the second conductive via 202 extends from below a bottom of the first conductive via 132, the second conductive via 202 has a greater height than the first conductive via 132.

Figure 3:
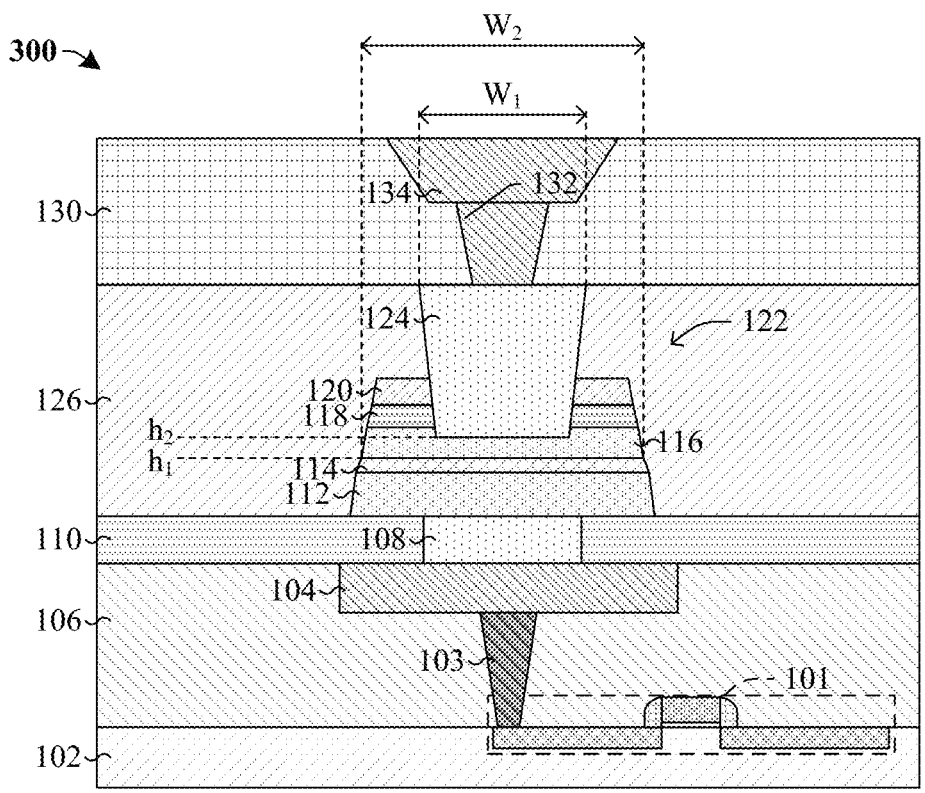
FIGS. 3-4 illustrate cross-sectional views of some embodiments of a memory device, according to the present disclosure.

Referring to FIG. 3, a cross-sectional view of a memory device 300 including a memory cell 122. The memory cell 122 is as the memory cell 122 of FIG. 1A is described and labeled.

A first height $h_1$ is defined at the bottommost surface of the top metal layer 116. A second height $h_2$ is defined at the bottommost surface of the top electrode 124. In some embodiments, a first distance between the first height $h_1$ and the second height $h_2$ is within a range of approximately 200 Angstroms and approximately 700 Angstroms. In some embodiments, the second height $h_2$ is below the topmost surface of the top metal layer 116 by a range of approximately 50 Angstroms to approximately 500 Angstroms.

A first width $W_1$ is defined between outermost sidewalls of the top electrode 124. A second width $W_2$ is defined between outermost sidewalls of the top metal layer 116. In some embodiments, the first width $W_1$ is within a range of approximately 1000 Angstroms and 3000 Angstroms. In some embodiments, the second width $W_2$ is within a range of approximately 1500 Angstroms and 4000 Angstroms. The first width $W_1$ is less than the second width $W_2$. The first width $W_1$ and the second width $W_2$ are respectively within outermost sidewalls of the bottom metal layer 112 and within outermost sidewalls of the interconnect wire 104. In some embodiments, the first width $W_1$ is less than a width of the bottom electrode 108. In some embodiments, the first width $W_1$ is greater than the width of the bottom electrode 108. In some embodiments, the first width $W_1$ is within outermost sidewalls of the bottom electrode 108.

Figure 4:
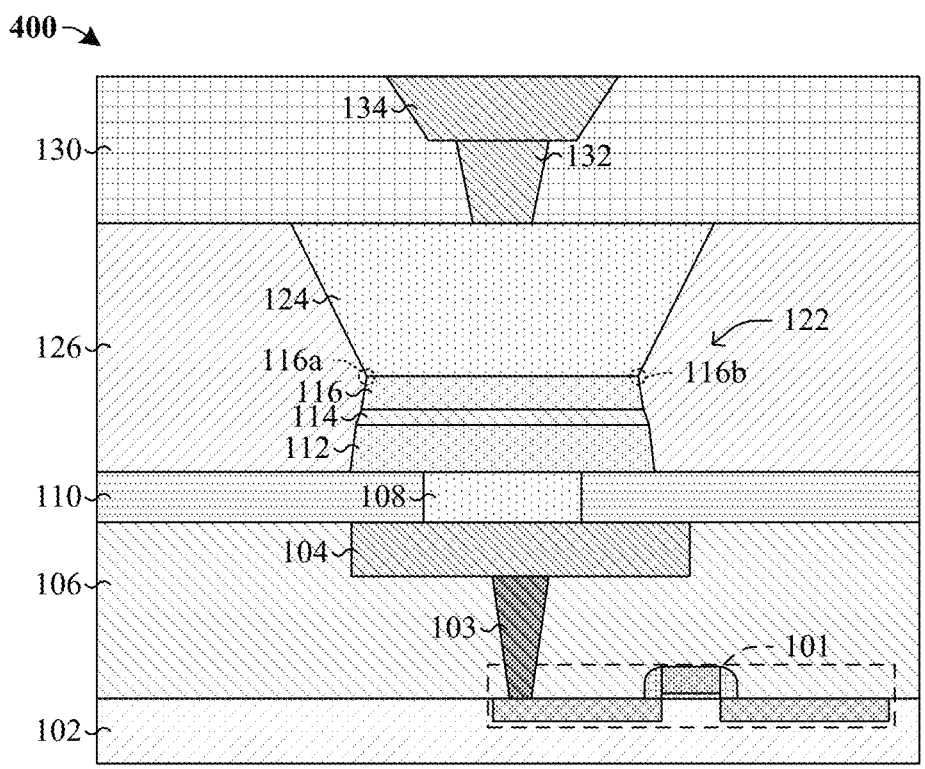

With reference to FIG. 4, a cross-sectional view 400 of some alternative embodiments of the memory device of FIG. 1A is provided in which the bottommost surface of the top electrode 124 completely overlies the topmost surface of the top metal layer 116. In some embodiments, the bottommost surface of the top electrode 124 continuously extends from a first outer edge 116a of the top metal layer 116 to a second outer edge 116b of the top metal layer 116. Outermost sidewalls of the top electrode 124 extend past outermost sidewalls of the memory cell 122 and outermost sidewalls of the first conductive wire 134.

Figure 5:
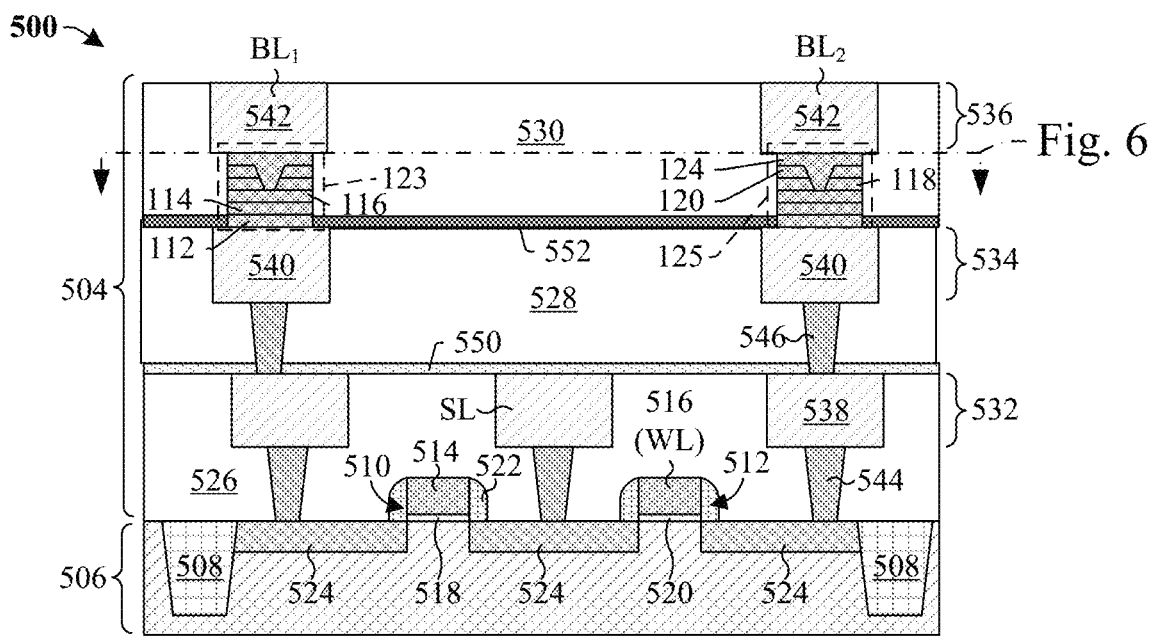
FIG. 5 illustrates a cross-sectional view illustrating some embodiments of a memory device that includes two memory cells, according to the present disclosure.

FIG. 5 illustrates a cross sectional view of some embodiments of an integrated circuit 500, which includes a first memory cell 123 and a second memory cell 125 disposed in an interconnect structure 504 of the integrated circuit 500. The first and second memory cells 123, 125 are each as the memory cell 122 of FIG. 1A is illustrated and described.

The integrated circuit 500 includes a substrate 506. The substrate 506 may be, for example, a bulk substrate (e.g., a bulk silicon substrate) or a silicon-on-insulator (SOI) substrate. The illustrated embodiment depicts one or more shallow trench isolation (STI) regions 508, which may include a dielectric-filled trench within the substrate 506.

The interconnect structure 504 is arranged over the substrate 506 and couples devices (e.g., transistors 510, 512) to one another. The interconnect structure 504 includes a plurality of IMD layers 526, 528, 530, and a plurality of metallization layers 532, 534, 536 which are layered over one another in alternating fashion. The IMD layers 526, 528, 530 may be made, for example, of a low K dielectric, such as un-doped silicate glass, or an oxide, such as silicon dioxide, or an extreme low K dielectric layer. The metallization layers 532, 534, 536 include metal lines 538, 540, 542, which are formed within trenches, and which may be made of a metal, such as copper or aluminum. Contacts 544 extend from the bottom metallization layer 532 to the source/drain regions 524 and/or gate electrodes 514, 516; and vias 546 extend between the metallization layers 532, 534, 536. The contacts 544 and the vias 546 extend through dielectric-protection layers 550, 552 (which can be made of dielectric material and can act as etch stop layers during manufacturing). The dielectric-protection layers 550, 552 may be made of an extreme low K dielectric material, for example. The contacts 544 and the vias 546 may be made of a metal, such as copper or tungsten, for example. In some embodiments, a metal line in the metal lines 538 may, for example, be electrically coupled to a source line (SL) such that an output of the access transistors 510, 512 may be accessed at the SL.

The interconnect structure 504 is arranged over the substrate 506 and couples devices (e.g., transistors 510, 512) to one another. The interconnect structure 504 includes a plurality of IMD layers 526, 528, 530, and a plurality of metallization layers 532, 534, 536 which are layered over one another in alternating fashion. The IMD layers 526, 528, 530 may be made, for example, of a low κ dielectric, such as un-doped silicate glass, or an oxide, such as silicon dioxide, or an extreme low K dielectric layer. The metallization layers 532, 534, 536 include metal lines 538, 540, 542, which are formed within trenches, and which may be made of a metal, such as copper or aluminum. Contacts 544 extend from the bottom metallization layer 532 to the source/drain regions 524 and/or gate electrodes 514, 516; and vias 546 extend between the metallization layers 532, 534, 536. The contacts 544 and the vias 546 extend through dielectric-protection layers 550, 552 (which can be made of dielectric material and can act as etch stop layers during manufacturing). The dielectric-protection layers 550, 552 may be made of an extreme low K dielectric material, for example. The contacts 544 and the vias 546 may be made of a metal, such as copper or tungsten, for example.

Figure 6:
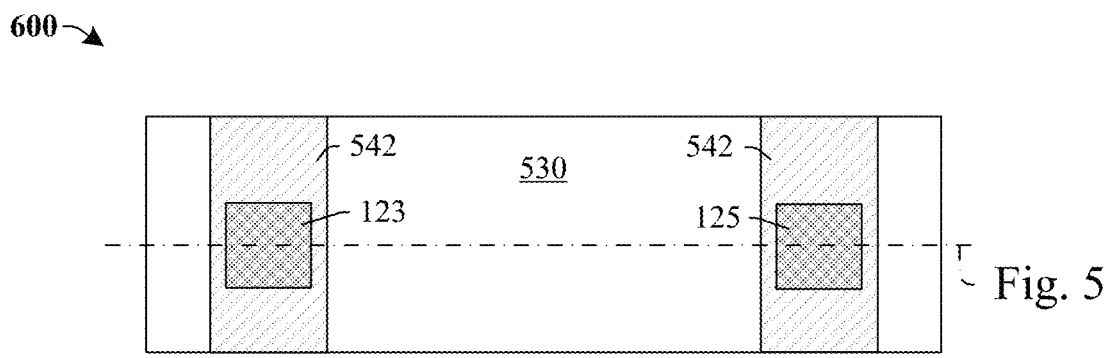
FIG. 6 illustrates a top view of the memory device of FIG. 5, as indicated by the cut-line in FIG. 5, according to the present disclosure.

FIG. 6 depicts some embodiments of a top view 600 of the integrated circuit 500 of FIG. 5, as indicated in the cut-away lines shown in FIGS. 5-6.

FIG. 6 depicts some embodiments of a top view of the integrated circuit 500 of FIG. 5, as indicated in the cut-away lines shown in FIGS. 5-6.

The first and second memory cells 123, 125 can have a square or circular shape when viewed from above in some embodiments. In other embodiments, however, for example due to practicalities of many etch processes, the corners of the illustrated square shape can become rounded, resulting in first and second memory cells 123, 125 having a square shape with rounded corners, or having a circular shape. The first and second memory cells 123, 125 are arranged over metal lines (540 of FIG. 5), respectively, and have upper portions in direct electrical connection with the metal lines 542, respectively, without vias or contacts there between in some embodiments. In other embodiments, vias or contacts couple the upper portion to the metal lines 542.

FIGS. 7-12 illustrate cross-sectional views 700-1200 of some embodiments of a method of forming a memory device including a memory cell according to the present disclosure. Although the cross-sectional views 700-1200 shown in FIGS. 7-12 are described with reference to a method, it will be appreciated that the structures shown in FIGS. 7-12 are not limited to the method but rather may stand alone separate of the method. Although FIGS. 7-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
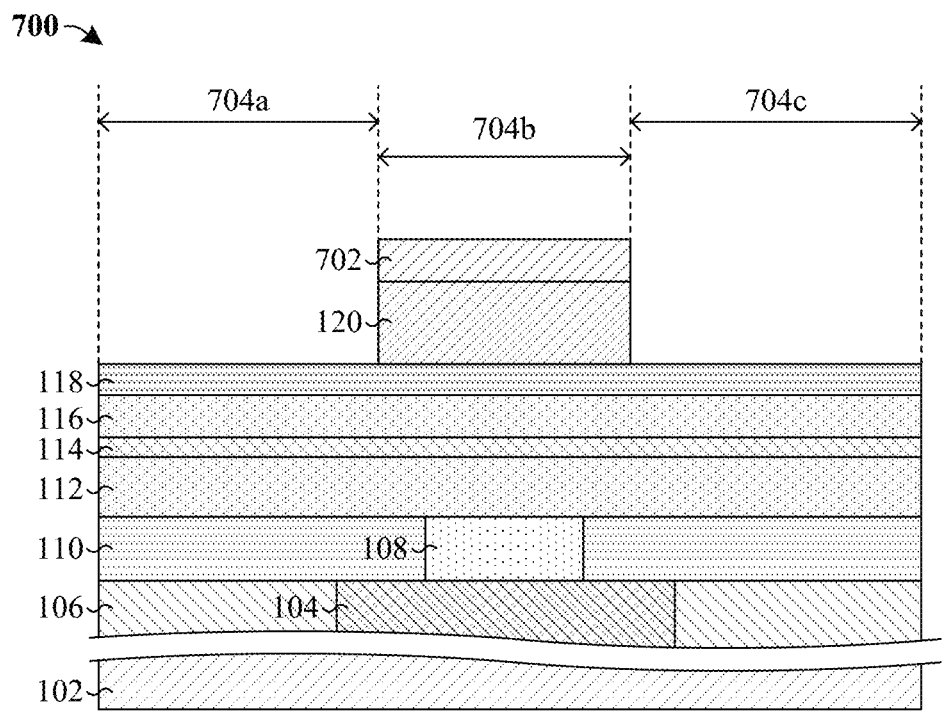
FIGS. 7-12 illustrate cross-sectional views of some embodiments of a method of forming a memory device, according to the present disclosure.

As shown in cross-sectional view 700 of FIG. 7, a first ILD structure 106 is formed over a substrate 102. An interconnect wire 104 is formed within the first ILD structure 106. In some embodiments, the interconnect wire 104 may be formed by way of a damascene process. A lower etch stop layer 110 is formed over the interconnect wire 104 and the first ILD structure 106. A bottom electrode 108 is formed within the lower etch stop layer 110 over the interconnect wire 104. A bottom metal layer 112 is formed over the lower etch stop layer 110. A dielectric data storage layer 114 is formed over the bottom metal layer 112. A top metal layer 116 is formed over the dielectric data storage layer 114. A first dielectric layer 118 (in some embodiments referred to as an etch stop layer) is formed over the top metal layer 116. A second dielectric layer 120 is formed over the first dielectric layer 118. A first masking layer 702 is formed over the second dielectric layer 120. In some embodiments, the above layers may be formed using a deposition process such as, for example, chemical vapor deposition (CVD), physical vapor deposition (PVD), some other suitable deposition process(es), or any combination of the foregoing.

Outermost sidewalls of the second dielectric layer 120 and outermost sidewalls of the first masking layer 702 are aligned. The second dielectric layer 120 and first masking layer 702 are comprised within a center region 704b directly above the first dielectric layer 118. An upper surface of the first dielectric layer 118 is left exposed in first and second sacrificial regions 704a, 704c outside of the center region 704b.

Figure 8:
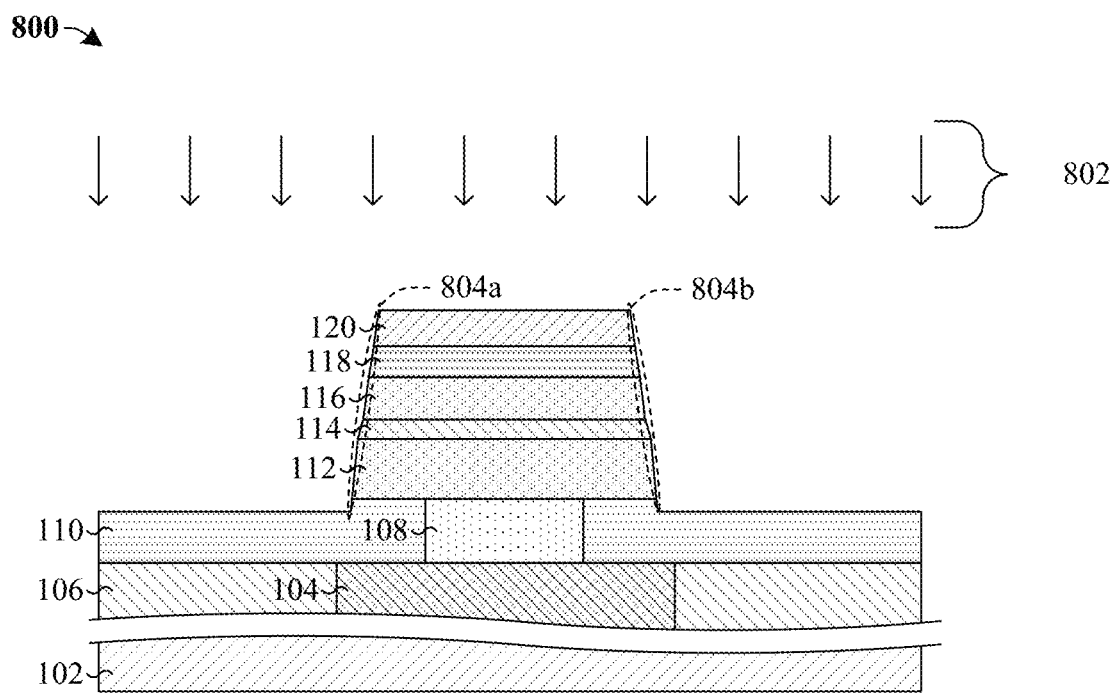

As shown in cross-sectional view 800 of FIG. 8, an etching process is performed to etch the second dielectric layer 120 and layers beneath the second dielectric layer 120. The etching process is performed by exposing the layers beneath the second dielectric layer 120 within the first and second sacrificial regions (704a, 704c of FIG. 7) to one or more etchant 802. The etching process, for example, may be performed by a photolithography/etching process and/or some other suitable patterning process(es). In various embodiments, the etching process may comprise a single etch (i.e., a continuous etch that etches the third dielectric layer 120, the bottom metal layer 112, the dielectric data storage layer 114, and the top metal layer 116) or multiple etches performed in-situ. The etching process completely removes the first masking layer (702 of FIG. 7) and a portion of the second dielectric layer 120. In some embodiments, the etching process completely removes the second dielectric layer 120. In some embodiments, the etching process removes approximately 200 Angstroms to approximately 600 Angstroms of the second dielectric layer 120. In some embodiments, the etching process removes approximately 50 Angstroms to approximately 500 Angstroms of the lower etch stop layer 110.

A first plurality of sidewalls 804a and a second plurality of sidewalls 804b do not comprise re-sputtered conductive materials. In some embodiments, each sidewall within the first plurality of sidewalls 804a are not electrically coupled together. In some embodiments, each sidewall within the second plurality of sidewalls 804b are not electrically coupled together. In some embodiments, each sidewall within the first plurality of sidewalls 804a are aligned. In some embodiments, each sidewall within the second plurality of sidewalls 804b are aligned.

Figure 9:
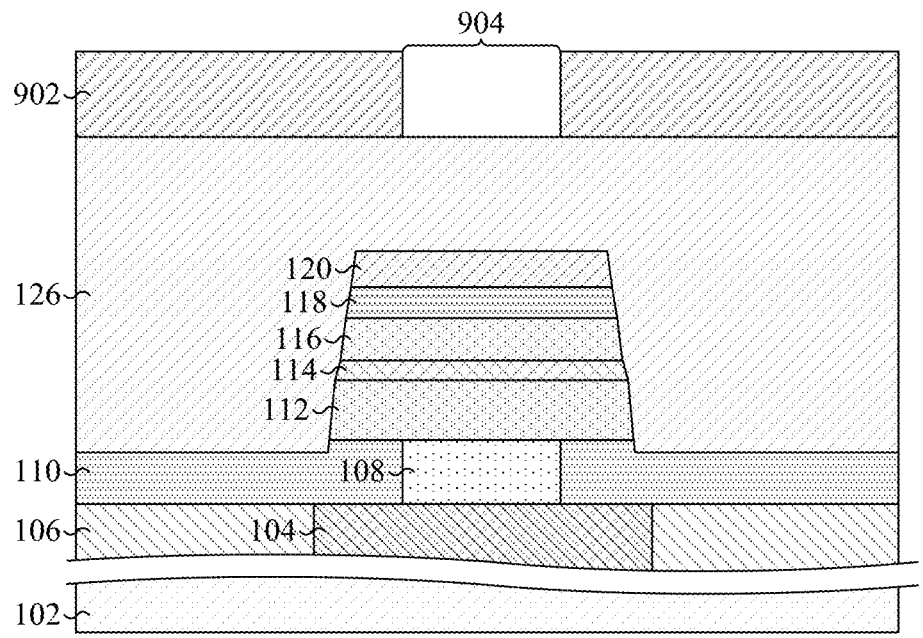

As shown in cross-sectional view 900 of FIG. 9, an IMD layer 126 is formed over the lower etch stop layer 110 and the second dielectric layer 120. In some embodiments, the IMD layer 126 directly contacts outermost sidewalls of the second dielectric layer 120, outermost sidewalls of the first dielectric layer 118, outermost sidewalls of the top metal layer 116, outermost sidewalls of the dielectric data storage layer 114, and outermost sidewalls of the bottom metal layer 112. A second masking layer 902 is formed over the IMD layer 126 and comprises a pair of sidewalls defining a first opening 904. In some embodiments, the second masking layer 902 may, for example, be or comprise a photoresist, silicon nitride (SiN), silicon carbide (SiC), or the like. The first opening 904 is directly above the top metal layer 116.

Figure 10:
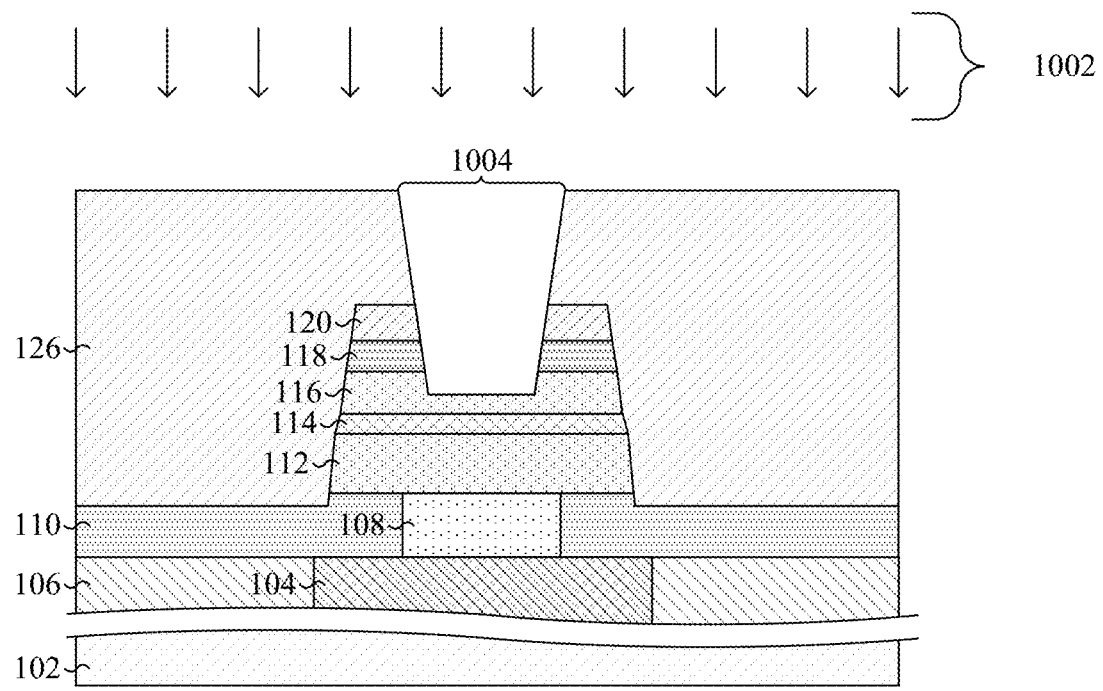

As shown in cross-sectional view 1000 of FIG. 10, an etching process is performed to remove a portion of the top metal layer 116, first dielectric layer 118, second dielectric layer 120, and the IMD layer 126. The etching process defines a second opening 1004 directly above the top metal layer 116, exposing an upper surface of the top metal layer 116. The etching process is performed by exposing the top metal layer 116, the first dielectric layer 118, the second dielectric layer 120, and the IMD layer 126 to one or more etchants 1002. The etching process, for example, may be performed by a photolithography/etching process and/or some other suitable patterning process(es). In some embodiments, the etching process removes approximately 50 Angstroms to approximately 500 Angstroms of the top metal layer 116. In some embodiments, the etching process does not remove any portion of the top metal layer 116.

Figure 11:
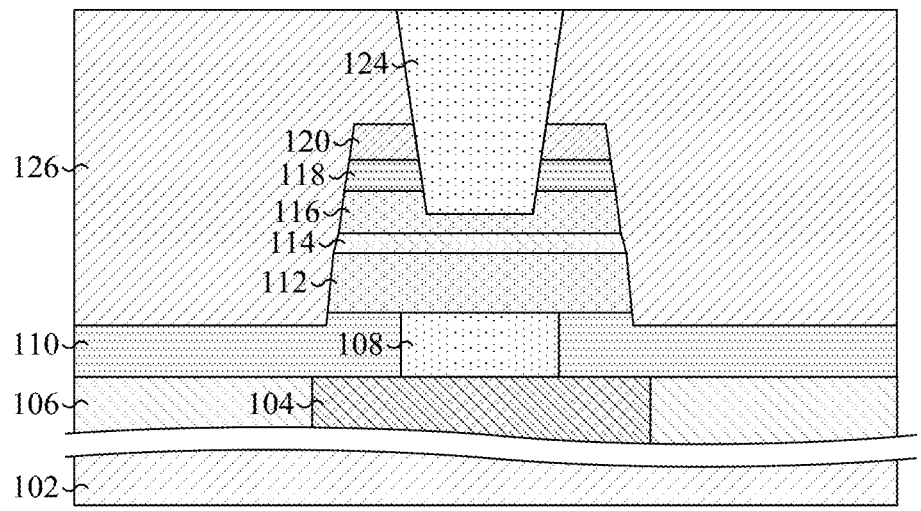

As shown in cross-sectional view 1100 of FIG. 11, a top electrode 124 is formed within the second opening (1004 of FIG. 10). A bottommost surface of the top electrode 124 is below a topmost surface of the top metal layer 116. In some embodiments, the bottommost surface of the top electrode 124 and the topmost surface of the top metal layer 116 are aligned at a level horizontal line. The top electrode 124 may, for example, be formed by depositing a conductive layer filling the second opening (1004 of FIG. 10) and covering the IMD layer 126 and performing a planarization into the conductive layer until the IMD layer 126 is reached.

In some alternative embodiments, the top metal layer 116 may be omitted from over the dielectric data storage layer 114. In such embodiments, the top electrode 124 may be formed directly onto the dielectric data storage layer 114 or onto a capping layer (not shown) overlying the dielectric data storage layer 114.

Figure 12:
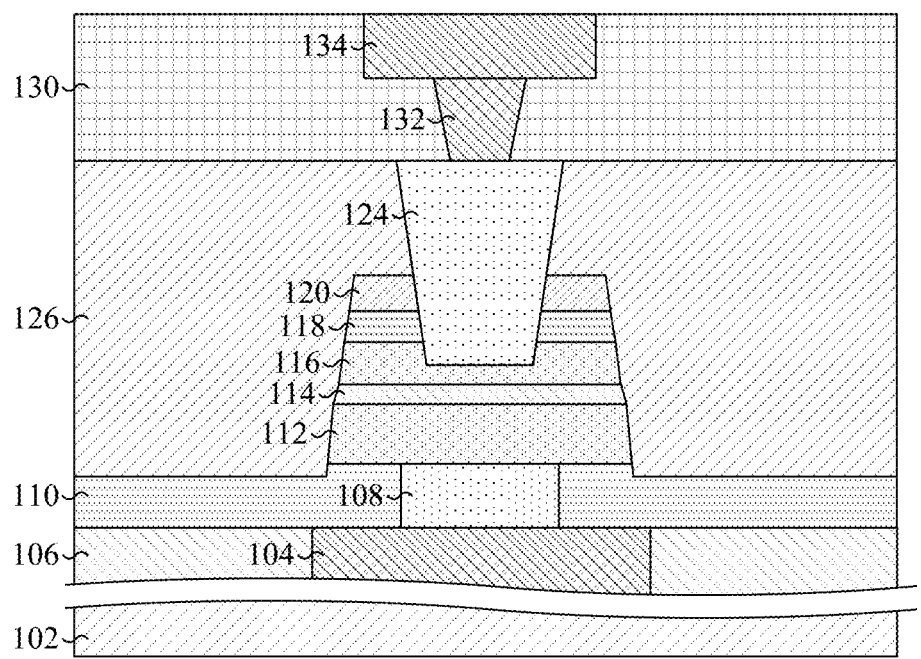

As shown in cross-sectional view 1200 of FIG. 12, a second ILD layer 130 is formed over the IMD layer 126. A first conductive via 132 is formed within the second ILD layer 130 over the top electrode 124. A first conductive wire 134 is formed within the second ILD layer 130 over the first conductive via 132. The second ILD layer 130 may, for example, be formed by CVD, PVD, some other suitable deposition process(es), or any combination of the foregoing. The first conductive via and wire 132, 134 may, for example, be formed by patterning the second ILD layer 130 to form via openings with a pattern of the first conductive via and/or wire 132, 134, depositing a conductive layer filling the via openings and covering the second ILD layer 130, and performing a planarization into the conductive layer until the second ILD layer 130 is reached. The patterning may, for example, be performed by a photolithography/etching process and/or some other suitable patterning process(es). The depositing may, for example, be performed by CVD, PVD, electroless plating, electroplating, some other suitable deposition process(es), or any combination of the foregoing. The planarization may, for example, be performed by a CMP and/or some other suitable planarization process(es).

Figure 13:
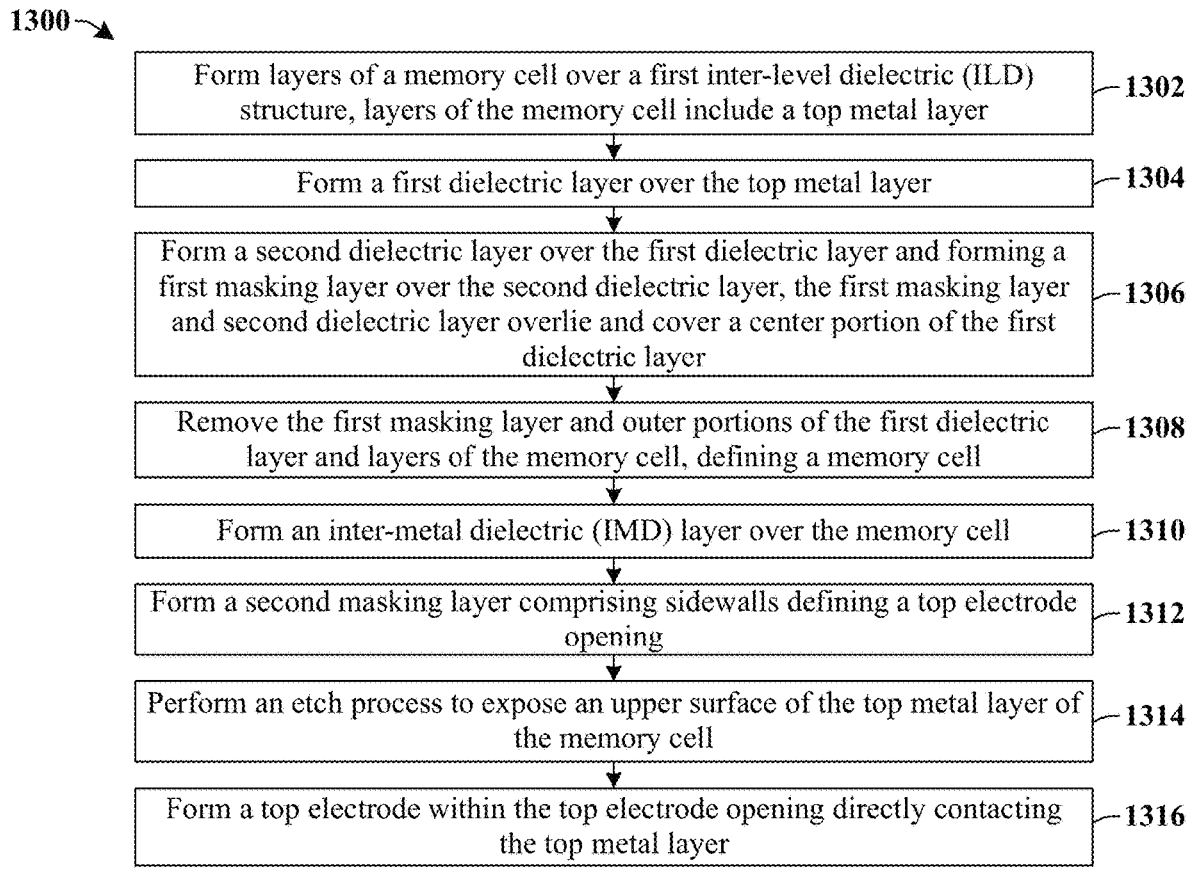
FIG. 13 illustrates a methodology in flowchart format that illustrates some embodiments of a method of forming a memory device, according to the present disclosure.

FIG. 13 illustrates a method 1300 of forming a memory device in accordance with some embodiments. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1302, layers of a memory cell are formed over a first inter-level dielectric (ILD) structure, layers of the memory cell include a top metal layer. FIG. 7 illustrates a cross-sectional view 700 corresponding to some embodiments of act 1302.

At 1304, a first dielectric layer formed over the top metal layer. FIG. 7 illustrates a cross-sectional view 700 corresponding to some embodiments of act 1304.

At 1306, a second dielectric layer is formed over the first dielectric layer and a first masking layer is formed over the second dielectric layer, the first masking layer and second dielectric layer overlie and cover a center portion of the first dielectric layer. FIG. 7 illustrates a cross-sectional view 700 corresponding to some embodiments of act 1306.

At 1308, the first masking layer is removed, outer portions of the first and second dielectric layers are removed, and outer portions of layers of the memory cell are removed. FIG. 8 illustrates a cross-sectional view 800 corresponding to some embodiments of act 1308.

At 1310, an inter-metal dielectric (IMD) layer is formed over the memory cell. FIG. 9 illustrates a cross-sectional view 900 corresponding to some embodiments of act 1310.

At 1312, a second masking layer is formed over the IMD layer comprising sidewalls defining a top electrode opening. FIG. 9 illustrates a cross-sectional view 900 corresponding to some embodiments of act 1312.

At 1314, an etch process is performed to expose an upper surface of the top metal layer of the memory cell. FIG. 10 illustrates a cross-sectional view 1000 corresponding to some embodiments of act 1314.

At 1316, a top electrode is formed within the top electrode opening directly contacting the top metal layer. FIG. 11 illustrates a cross-sectional view 1100 corresponding to some embodiments of act 1316.

Accordingly, in some embodiments, the present disclosure relates to a method of forming a memory cell that comprises forming a top electrode over the memory cell after patterning layers of the memory cell.

In some embodiments, the present disclosure relates to a method for manufacturing a memory device. The method includes forming a memory cell stack over a lower interconnect layer over a substrate, wherein the memory cell stack includes a data storage layer over a bottom metal; forming a first dielectric layer over the memory cell stack; forming a first masking layer over the first dielectric layer, wherein the first masking layer overlies a center portion of the first dielectric layer and leaves a sacrificial portion of the first dielectric layer uncovered; performing a first etch of the first dielectric layer and the memory cell stack according to the first masking layer; forming an inter-metal dielectric (IMD) layer over the memory cell stack after performing the first etch; forming a top electrode within the IMD layer and directly over the memory cell stack; and forming an upper interconnect layer over the top electrode, wherein the upper interconnect layer and the lower interconnect layer comprise a different material than the top electrode.

In other embodiments, the present disclosure relates to a memory device. The memory device includes a resistive random access memory (RRAM) cell disposed over a bottom electrode and comprising a data storage layer between a top metal layer and a bottom metal layer, wherein outermost sidewalls of the data storage layer, the top metal layer, and the bottom metal layer are substantially aligned; an inter-metal dielectric (IMD) layer over the RRAM cell; and a top electrode overlying the RRAM cell and within the IMD layer, wherein the top electrode has a bottom surface with a first width and a top surface with a second width that is greater than the first width, the bottom surface of the top electrode contacting the top metal layer at a position set back from a sidewall of the top metal layer by a non-zero distance.

In yet other embodiments, the present disclosure relates to a memory device. The memory device includes a resistive random access memory (RRAM) cell disposed over a bottom electrode within a memory array region, wherein the RRAM cell includes a data storage layer between a top metal layer and a bottom metal layer; an inter-metal dielectric (IMD) layer over the RRAM cell; a top electrode overlying the RRAM cell and within the IMD layer such that a top surface of the top electrode is aligned with a top surface of the IMD layer, wherein the top electrode extends through an etch stop layer of the RRAM cell to directly contact the top metal layer; an inter-level dielectric (ILD) layer over the IMD layer within the memory array region; a logic region adjacent to the memory array region, wherein a first lower surface of the ILD layer within the memory array region is above a second lower surface of the ILD layer within the logic region, a difference between the first lower surface and the second lower surface is defined by a height; and wherein the height is equal to a distance between a bottom surface of the bottom metal layer and the top surface of the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a resistive random access memory (RRAM) cell disposed over a bottom electrode and comprising a data storage layer between a top metal layer and a bottom metal layer, wherein an etch stop layer overlies the top metal layer, wherein an upper dielectric layer overlies the etch stop layer, wherein opposing straight sidewalls of the data storage layer, opposing straight sidewalls of the top metal layer, opposing straight sidewalls of the bottom metal layer, and opposing straight sidewalls of the etch stop layer are substantially aligned and are respectively slanted relative to a line that is normal to a top surface of the bottom electrode, wherein the etch stop layer comprises a first dielectric material and the upper dielectric layer comprises a second dielectric material different from the first dielectric material, and wherein the data storage layer comprises the second dielectric material;
an inter-metal dielectric (IMD) layer over the RRAM cell; and
a top electrode overlying the RRAM cell and within the IMD layer, wherein the top electrode extends through the etch stop layer and the upper dielectric layer to the top metal layer, wherein the top electrode has a bottom surface with a first width and a top surface with a second width that is greater than the first width, the bottom surface of the top electrode contacting the top metal layer at a position set back from a sidewall of the top metal layer by a non-zero distance.

2. The memory device of claim 1, further comprising:
an upper interconnect layer contacting the top electrode, wherein the top electrode and the bottom electrode are comprised of a first material, and wherein the upper interconnect layer is comprised of a second material that is different than the first material.

3. The memory device of claim 2, wherein the first material is titanium nitride and the second material is copper or aluminum.

4. The memory device of claim 1, wherein a width of the top electrode continuously decreases from the top surface of the top electrode to the bottom surface of the top electrode in a first direction, wherein a width of the RRAM cell continuously increases from a top surface of the RRAM cell to a bottom surface of the RRAM cell in the first direction.

5. The memory device of claim 1, wherein a maximum width of the top electrode is greater than a width of the bottom electrode.

6. The memory device of claim 1, wherein a bottom surface of the upper dielectric layer is disposed above a top surface of the top metal layer.

7. The memory device of claim 1, wherein opposing straight sidewalls of the upper dielectric layer are substantially aligned with the opposing straight sidewalls of the etch stop layer.

8. A memory device comprising:
a resistive random access memory (RRAM) cell disposed over a bottom electrode within a memory array region, wherein the RRAM cell includes a data storage layer between a top metal layer and a bottom metal layer;
an inter-metal dielectric (IMD) layer over the RRAM cell;
a top electrode overlying the RRAM cell and within the IMD layer such that a top surface of the top electrode is aligned with a top surface of the IMD layer, wherein the top electrode extends through an etch stop layer of the RRAM cell to directly contact the top metal layer;
an inter-level dielectric (ILD) layer over the IMD layer within the memory array region;
a logic region adjacent to the memory array region, wherein a first lower surface of the ILD layer within the memory array region is above a second lower surface of the ILD layer within the logic region, a difference between the first lower surface and the second lower surface is defined by a height; and
wherein the height is equal to a distance between a bottom surface of the bottom metal layer and the top surface of the top electrode.

9. The memory device of claim 8, wherein a maximum width of the top electrode is less than a minimum width of the RRAM cell.

10. The memory device of claim 8, wherein the top electrode and the bottom electrode are comprised of a first material different than a second material the top metal layer and the bottom metal layer are comprised of.

11. The memory device of claim 10, wherein an upper interconnect structure is disposed within the ILD layer in the memory array region and the logic region, the upper interconnect structure is comprised of a third material different than the first material and the second material.

12. The memory device of claim 8, further comprising:
a conductive via disposed within a logic region and continuously extending from an upper conductive wire to a lower conductive wire, wherein an upper surface of the conductive via is disposed above the top surface of the top electrode and a lower surface of the conductive via is disposed below the bottom surface of the bottom metal layer.

13. The memory device of claim 8, wherein a width of a bottom surface of the top electrode is less than a maximum width of the bottom electrode and a width of the top surface of the top electrode is greater than the maximum width of the bottom electrode.

14. The memory device of claim 13, wherein the bottom electrode is spaced laterally between sidewalls of the RRAM cell.

15. A memory device comprising:
a resistive random access memory (RRAM) cell overlying a bottom electrode and comprising a data storage layer between a top metal layer and a bottom metal layer, wherein sidewalls of the data storage layer, sidewalls of the top metal layer, and sidewalls of the bottom metal layer are substantially aligned and are respectively slanted at a non-zero angle, wherein a width of the RRAM cell continuously decreases from a bottom surface of the RRAM cell to a top surface of the RRAM cell;
an inter-metal dielectric (IMD) layer overlying the RRAM cell, wherein the IMD layer directly contacts the sidewalls of the data storage layer, the sidewalls of the top metal layer, and the sidewalls of the bottom metal layer; and
a top electrode overlying the RRAM cell and disposed within the IMD layer, wherein a width of the top electrode continuously decreases from a top surface of the top electrode to a bottom surface of the top electrode, wherein the bottom surface of the top electrode directly contacts the top metal layer, and wherein the bottom surface of the top electrode is vertically offset from a top surface of the top metal layer by a non-zero distance.

16. The memory device of claim 15, wherein the IMD layer and the data storage layer comprise a same material.

17. The memory device of claim 15, wherein the RRAM cell further comprises:
a first dielectric layer overlying the top metal layer and comprising a first dielectric material;
a second dielectric layer overlying the first dielectric layer and comprising a second dielectric material different from the first dielectric material; and
wherein the top electrode continuously extends through the first and second dielectric layers.

18. The memory device of claim 17, further comprising:
a lower etch stop layer underlying the RRAM cell, wherein a top surface of the lower etch stop layer contacts a bottom surface of the bottom metal layer, wherein an upper surface of the lower etch stop layer is disposed below the bottom surface of the bottom metal layer by a non-zero distance, wherein the lower etch stop layer laterally encloses the bottom electrode.

19. The memory device of claim 18, wherein the lower etch stop layer comprises the first dielectric material.

20. The memory device of claim 15, wherein the top metal layer continuously extends from a sidewall of the top electrode to the bottom surface of the top electrode.

* * * * *